(12) United States Patent
Kim et al.

(10) Patent No.: US 10,748,827 B2
(45) Date of Patent: Aug. 18, 2020

(54) PACKAGED SEMICONDUCTOR DEVICES FOR HIGH VOLTAGE WITH DIE EDGE PROTECTION

(71) Applicant: Texas Instruments Incorporated, Dallas, TX (US)

(72) Inventors: Woochan Kim, San Jose, CA (US); Vivek Arora, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/120,922

(22) Filed: Sep. 4, 2018

(65) Prior Publication Data
US 2020/0075441 A1 Mar. 5, 2020

(51) Int. Cl.
*H01L 23/31* (2006.01)
*H01L 23/29* (2006.01)
(Continued)

(52) U.S. Cl.
CPC ........ *H01L 23/3114* (2013.01); *H01L 21/561* (2013.01); *H01L 21/565* (2013.01); *H01L 21/78* (2013.01); *H01L 23/291* (2013.01); *H01L 23/293* (2013.01); *H01L 23/3135* (2013.01); *H01L 23/3171* (2013.01); *H01L 23/49541* (2013.01); *H01L 24/03* (2013.01); *H01L 24/05* (2013.01); *H01L 24/48* (2013.01); *H01L 24/83* (2013.01); *H01L 24/85* (2013.01); *H01L 24/92* (2013.01); *H01L 24/94* (2013.01); *H01L 24/97* (2013.01); H01L 24/16 (2013.01); H01L 24/32 (2013.01); H01L 24/73 (2013.01); H01L 2224/0231 (2013.01); H01L 2224/0239 (2013.01); H01L 2224/0391 (2013.01); H01L 2224/04042 (2013.01); H01L 2224/16157 (2013.01); H01L 2224/16245 (2013.01); H01L 2224/32245 (2013.01); H01L 2224/48091 (2013.01); H01L 2224/48106 (2013.01); H01L 2224/48247 (2013.01); H01L 2224/48464 (2013.01); H01L 2224/73265 (2013.01); H01L 2224/83005 (2013.01); H01L 2924/01029 (2013.01)

(58) Field of Classification Search
None
See application file for complete search history.

(56) References Cited

U.S. PATENT DOCUMENTS

2018/0166420 A1* 6/2018 Park ................... H01L 25/0657

* cited by examiner

*Primary Examiner* — Long Pham
(74) *Attorney, Agent, or Firm* — Dawn Jos; Charles A. Brill; Frank D. Cimino

(57) ABSTRACT

In a described example a device includes: a first corner formed between a circuit side surface of a semiconductor die and a first sidewall formed with a first depth extending along a side of the semiconductor die from the circuit side surface; a ledge having a planar surface formed parallel to the circuit side surface of the semiconductor die formed at the first depth from the circuit side surface at the first corner, and being perpendicular to the first sidewall; a second corner formed by an intersection of the planar surface of the ledge and a scribe lane sidewall of the semiconductor die, forming a second sidewall perpendicular to the circuit side surface; and portions of the circuit side surface of the semiconductor die, the first corner, the first sidewall, and the planar surface of the ledge covered by a passivation layer.

15 Claims, 15 Drawing Sheets

(51) Int. Cl.
*H01L 23/00* (2006.01)
*H01L 23/495* (2006.01)
*H01L 21/78* (2006.01)
*H01L 21/56* (2006.01)

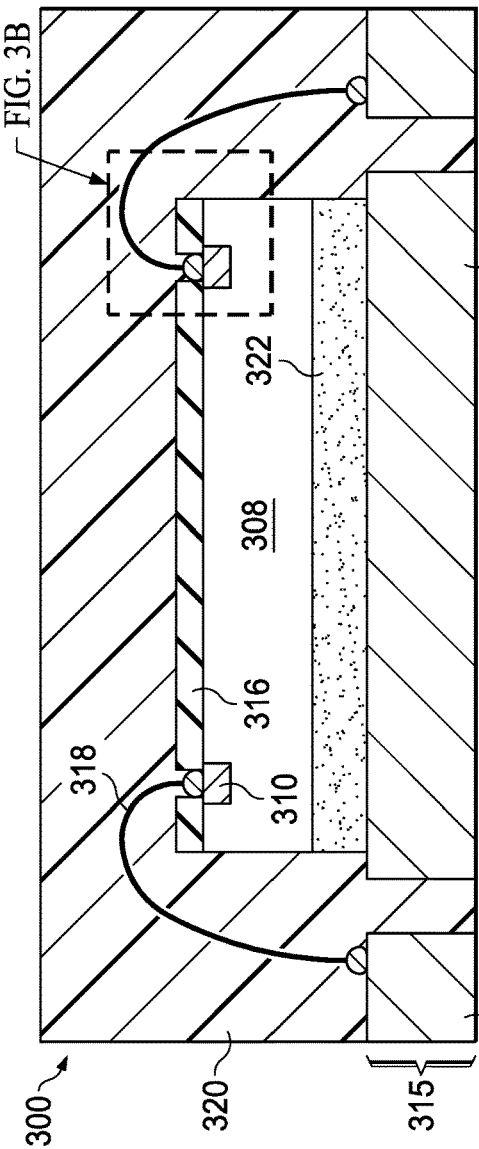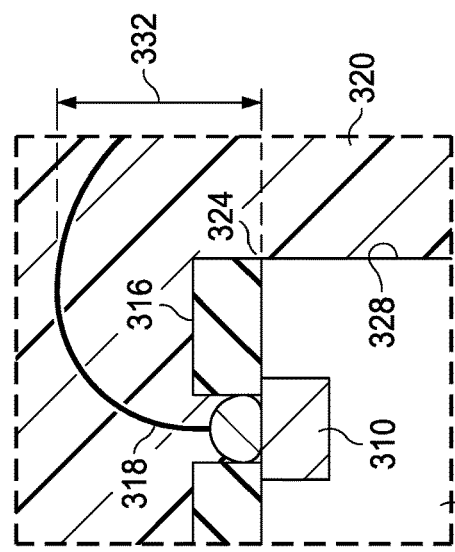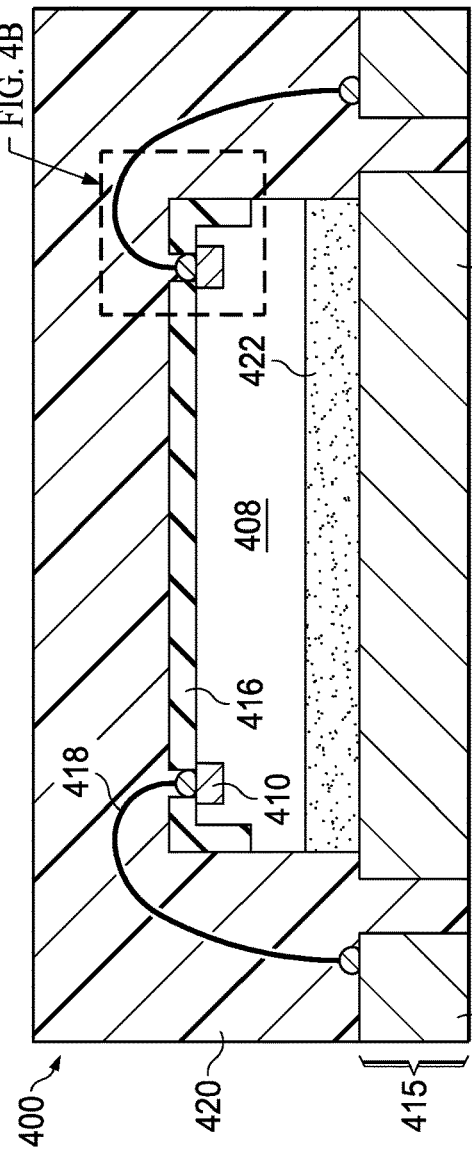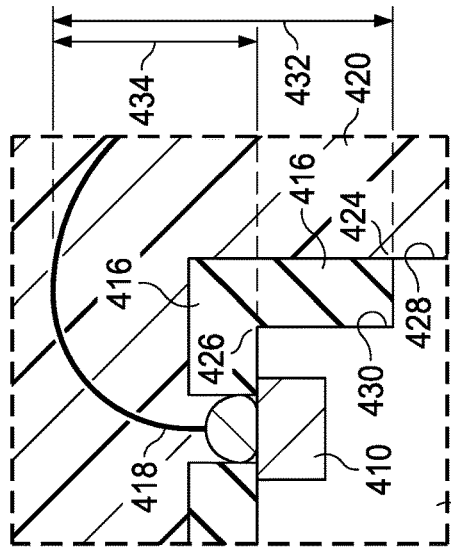

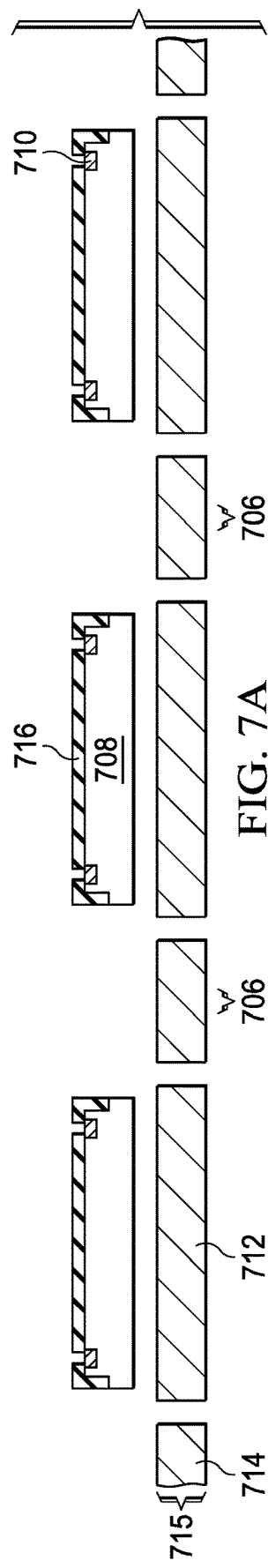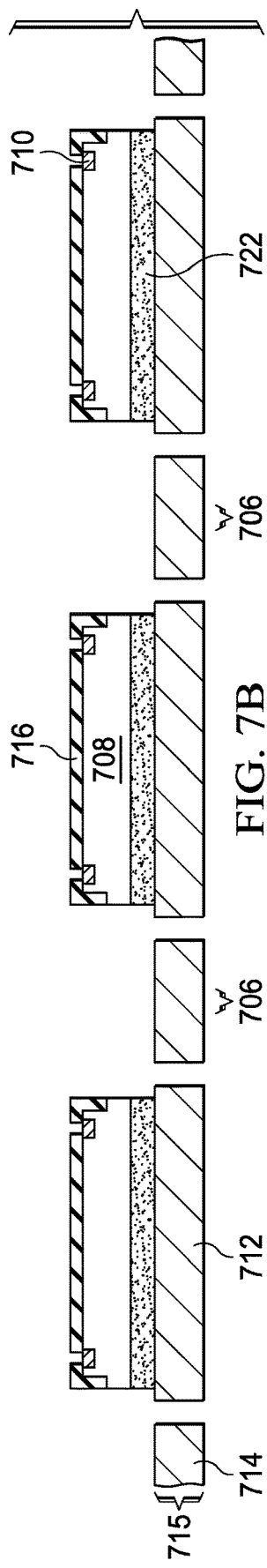

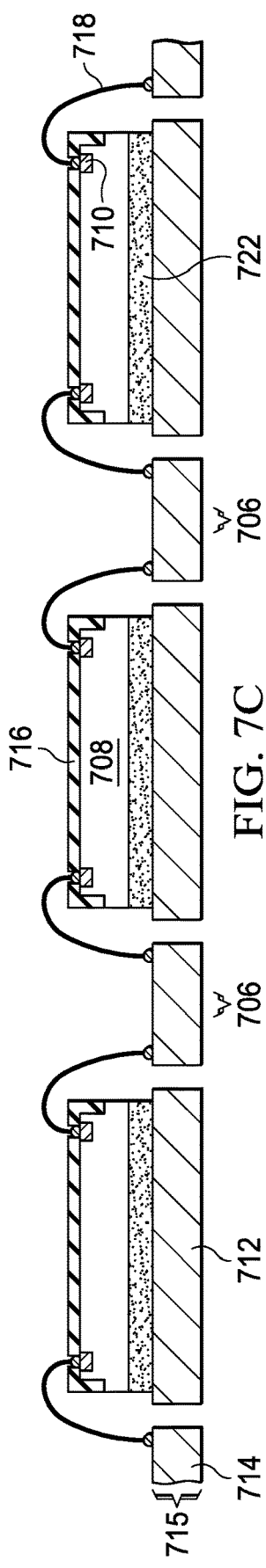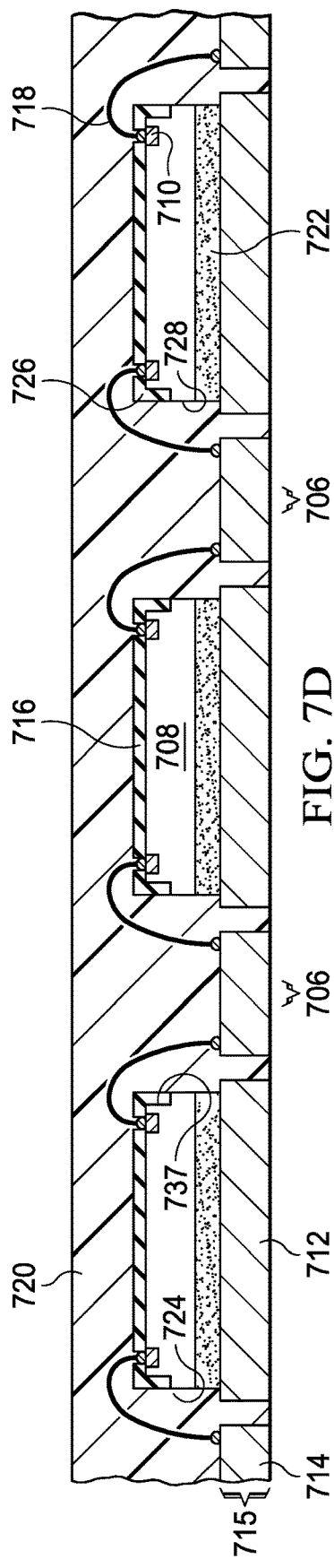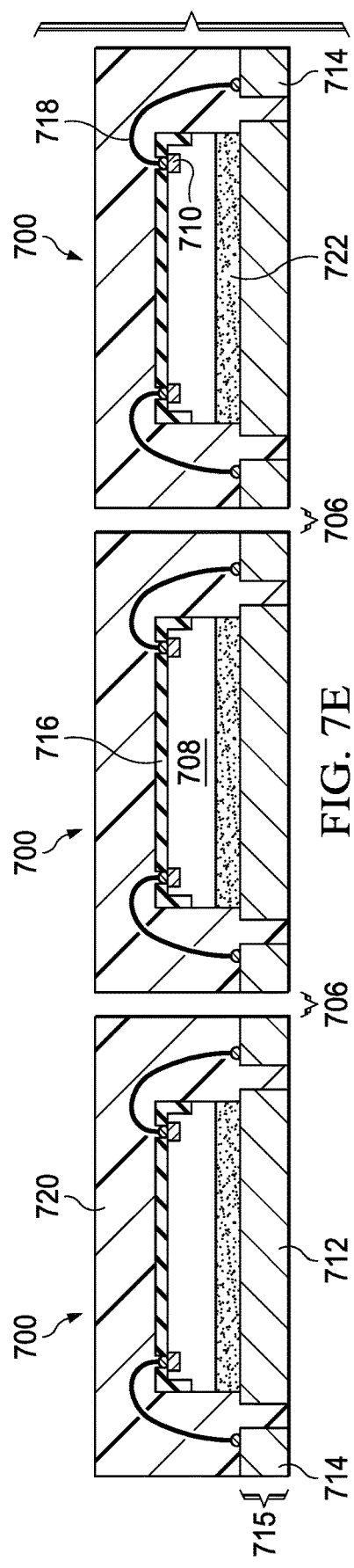
FIG. 7C
FIG. 7D
FIG. 7E

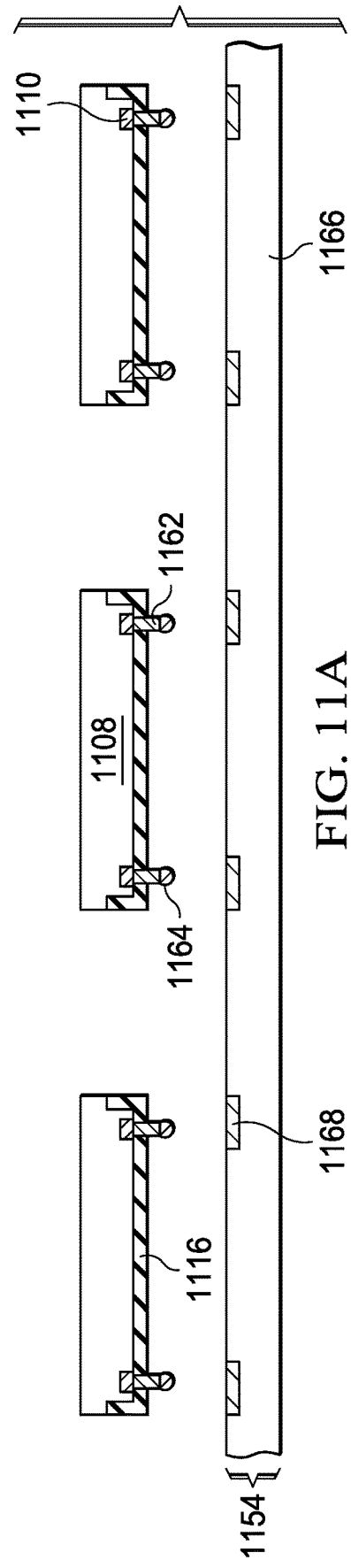
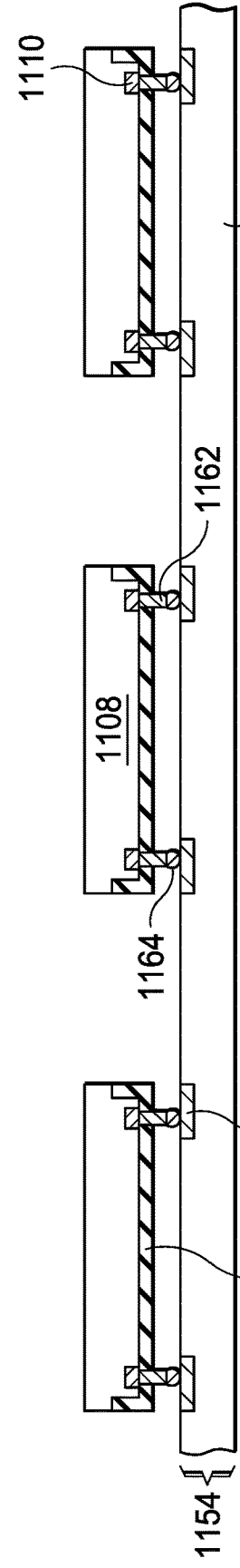
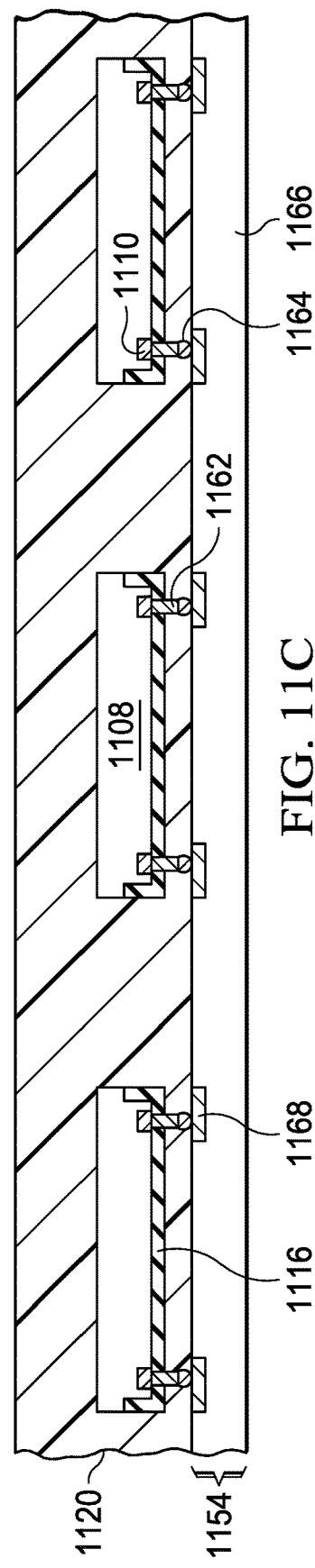
FIG. 11A
FIG. 11B
FIG. 11C

PACKAGED SEMICONDUCTOR DEVICES FOR HIGH VOLTAGE WITH DIE EDGE PROTECTION

TECHNICAL FIELD

This disclosure relates generally to packaged semiconductor devices, and more particularly to packaged semiconductor devices for high voltages.

SUMMARY

In a described example, a device includes: a first corner formed between a circuit side surface of a semiconductor die and a first sidewall formed with a first depth extending along a side of the semiconductor die from the circuit side surface. A ledge is formed having a planar surface parallel to the circuit side surface of the semiconductor die formed at the first depth from the circuit side surface at the first corner, and being perpendicular to the first sidewall. A second corner is formed by an intersection of the planar surface of the ledge and a scribe lane sidewall of the semiconductor die, forming a second sidewall perpendicular to the circuit side surface. A passivation layer covers portions of the circuit side surface of the semiconductor die, the first corner, the first sidewall, and the planar surface of the ledge.

BRIEF DESCRIPTION OF THE DRAWINGS

FIGS. 3A and 3B are cross sections of a no lead package for a packaged semiconductor device and FIG. 3C is a perspective view of a quad flat no lead (QFN) package.

FIG. 4A is cross section of a no lead package for a semiconductor device and FIG. 4B is an expanded cross sectional view of an upper corner of a semiconductor die in the no lead package of FIG. 4A.

FIGS. 7A-7E are a series of cross sections illustrating steps in a method for making a packaged semiconductor device for high voltage.

FIGS. 11A-11E are a series of cross sections illustrating steps in a method for making a packaged semiconductor device for high voltage.

DETAILED DESCRIPTION

Figure 1A:
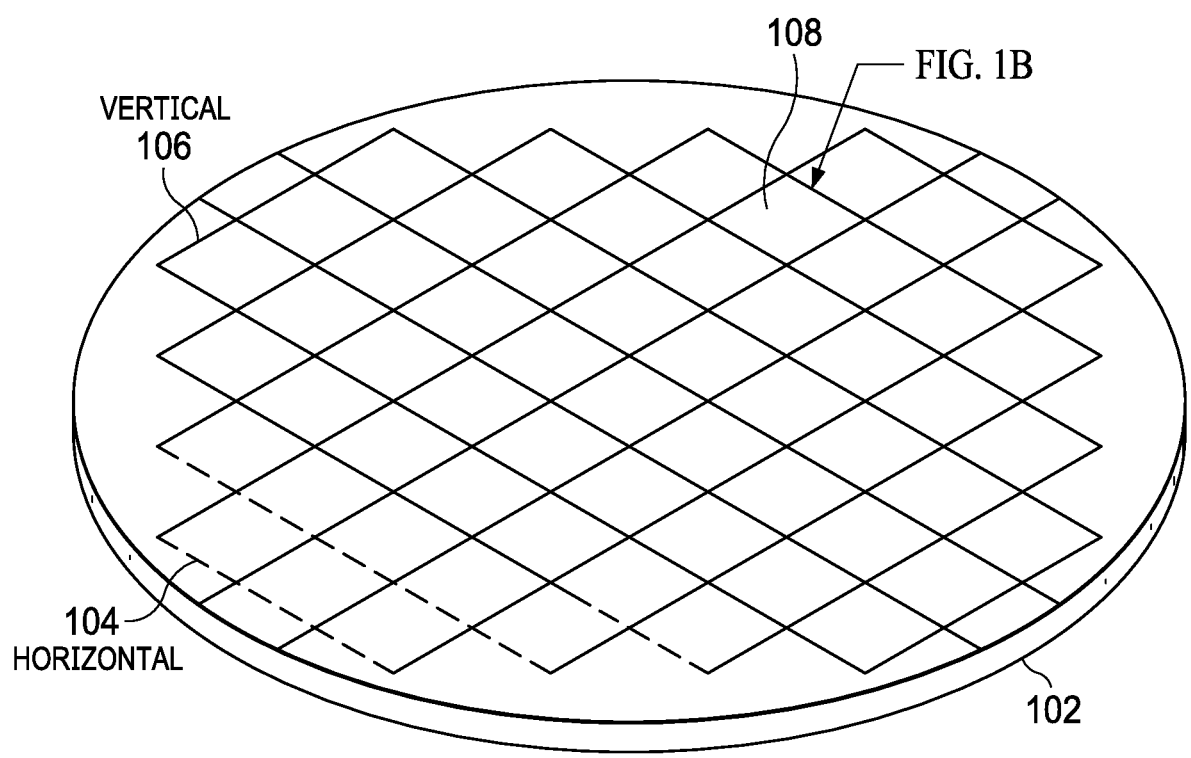
FIGS. 1A and 1B are perspective views of a semiconductor wafer with semiconductor dies formed in the semiconductor wafer and separated by scribe streets, and an example semiconductor die.

Corresponding numerals and symbols in the different figures generally refer to corresponding parts, unless otherwise indicated. The figures are not necessarily drawn to scale. Elements may be described as "encapsulated" herein. When a semiconductor device package is formed using mold compound, the packaged device is referred to as "encapsulated" and the process for molding may be referred to as "encapsulation". As used herein, when a semiconductor die mounted to a substrate is described as encapsulated, portions of the substrate remain exposed to form leads or terminals for the package, even though it is described as "encapsulated" or even when it is described as being formed by "encapsulation."

During a molding process, a substrate (for example, a lead frame) with a semiconductor device bonded to it is placed in an injection or transfer mold. Mold compound, such as thermoset epoxy resin, is injected into the mold to cover, or encapsulate, the semiconductor device and lead frame and form a packaged semiconductor device. In some examples, a lead frame strip is placed into a molding tool with several semiconductor devices mounted to it and spaced from one another. After the mold compound is used to form package material over the semiconductor devices and the lead frame strip, the devices are cut apart to form single packaged semiconductor devices by sawing through the mold compound and the lead frame strip in saw streets between the packaged semiconductor devices. A "semiconductor device" as used herein means a device fabricated using a semiconductor substrate. An example is an integrated circuit where one or more active devices, such as transistors, are formed in a single device and are coupled together with conductive material to perform a circuit function. However, a semiconductor device also includes discrete devices, such as a single transistor, a diode, a resistor, a capacitor or an inductor formed on a semiconductor substrate. Arrays of passive devices such as resistors or capacitors can also be formed as a semiconductor device, even when the device has no active devices. Sensors such as photosensitive cells and acoustic sensors can be formed as semiconductor devices.

As is further described hereinbelow, certain structures and surfaces are described as "perpendicular" to one another. For purposes of this disclosure, two elements are "perpendicular" when the elements are intended to form a 90-degree angle at their intersection. However, the term "perpendicular" as used herein also includes surfaces that may slightly deviate from 90 degrees due to manufacturing tolerances. The term "bond pad" is used herein. A bond pad is a conductive element formed on a circuit side surface of a semiconductor die, the bond pad is coupled to devices in the semiconductor device and provides a surface for connecting a conductor such as a bond wire, ribbon bond, pillar, ball or bump. The bond pad can be formed of a conductor layer such as copper or aluminum. Bond pads can also have additional platings to enhance bonding, such as nickel, gold, palladium, silver and combinations of these to enhance wire bonding efficiency and to reduce corrosion or oxidation of copper. The platings can include electroless nickel and immersion gold (ENIG) or electroless nickel, electroless palladium, immersion gold (ENEPIG) for example.

The term "high voltage" is used herein. In using semiconductor devices, typical systems use voltages between 1 and 6 volts, for example 1.8, 3.3, 5 and 6 volt systems are used in battery powered systems, computers, and in some automotive systems. Increasingly there is a need for integrated circuit and discrete components formed as semiconductor devices that are able to carry current at higher voltages, such as at or greater than 30 volts and up to several hundred volts. The term "high voltage" as used herein means a voltage equal to or greater than 30 volts. Semiconductor devices coupled to high voltages can exhibit failures due to the coupling of dies to higher voltages.

The term "scribe lane" is used herein. A scribe lane is a portion of semiconductor wafer between semiconductor devices. Sometimes in related literature the term "scribe street" is used. Once processing is finished and the semiconductor devices are complete, the semiconductor devices are separated into individual semiconductor dies by severing the semiconductor wafer along the scribe lanes. This process is referred to as "singulation." Scribe lanes will be arranged on four sides of a semiconductor device on the wafer. When the semiconductor devices are singulated from one another, rectangular semiconductor dies are formed. The term "saw streets" is used herein. As used herein, a saw street is a portion of a substrate such as a lead frame strip between interconnected lead frames that have semiconductor devices mounted to them. After packaging with mold compound is completed, the packaged semiconductor devices are singulated one from another by cutting through the lead frame strip and the mold compound in the saw streets to form individual semiconductor packages. The term "gap" is used herein. As used herein, a "gap" is a space between two objects. The space can be filled with air or another material, in an example described herein a gap is filled with mold compound. The term "ledge" is used herein. As used herein, a "ledge" is a surface extending away from a wall or side of an object. In some examples, with respect to a particular orientation of an object, the ledge can be horizontal and may extend away from a side surface of the object that can be vertical.

In example arrangements, the problem of coupling high voltage signals to a semiconductor die where failures can occur at the edge of a semiconductor die due to electrical shorting from the semiconductor material to a conductor is solved by forming a ledge at the edge of the semiconductor die, and protecting the edge with a protective passivation layer. The distance from a bond wire conductor or ribbon wire conductor to the semiconductor substrate is thereby increased, and failures are reduced or prevented when high voltage signals are carried by conductors coupled to bond pads on the semiconductor die.

FIG. 1A is a projection view of a semiconductor wafer 102 after manufacture and prior to singulation. Rectangular shaped dies 108 cover the surface of the wafer 102. The surface of 102 visible in FIG. 1A is the processed side, sometimes called the "front side", the "top side" or the "circuit side" of wafer 102, the surface where semiconductor processing is performed to form devices. An opposing side, not visible in FIG. 1A, lies on the opposite surface, and may be referred to as the "back side" of the wafer 102.

The rectangular shaped dies 108 are separated by horizontal scribe lanes (horizontal as the wafer 102 is oriented in FIG. 1A) 104 that form the first two sides of the rectangle and by vertical scribe lanes 106 (again, as the wafer 102 is oriented in FIG. 1A) that form the second two sides of the rectangular periphery of each die 108. After the semiconductor wafer manufacturing is complete, the dies 108 are singulated from one another by cutting through the semiconductor device wafer 102 along the scribe lanes 104 and 106. The cuts can be done mechanically by sawing, by laser tools, or by using a laser to perform "stealth dicing" where laser energy forms cracks in the crystalline structure of the semiconductor wafer. The cracks are then caused to propagate through the scribe lanes 104, 106 to separate the dies 108 along the scribe lanes.

Figure 1B:
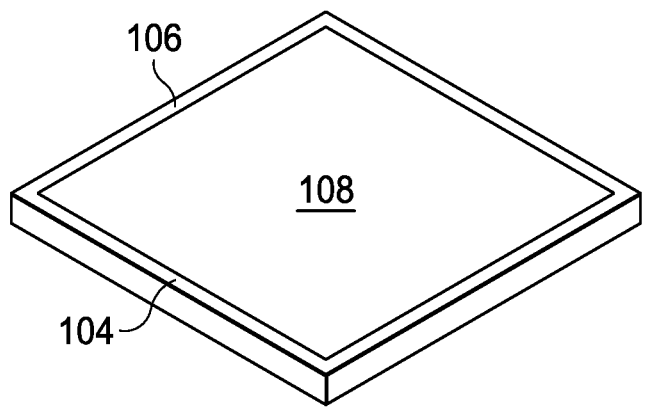

FIG. 1B is an expanded, projection view of one of the semiconductor dies 108 after singulation. Sidewalls on the die 108 (referred to hereinbelow as "scribe lane sidewalls") form when a cut is made through the wafer 102 during the singulation process.

Figure 2A:
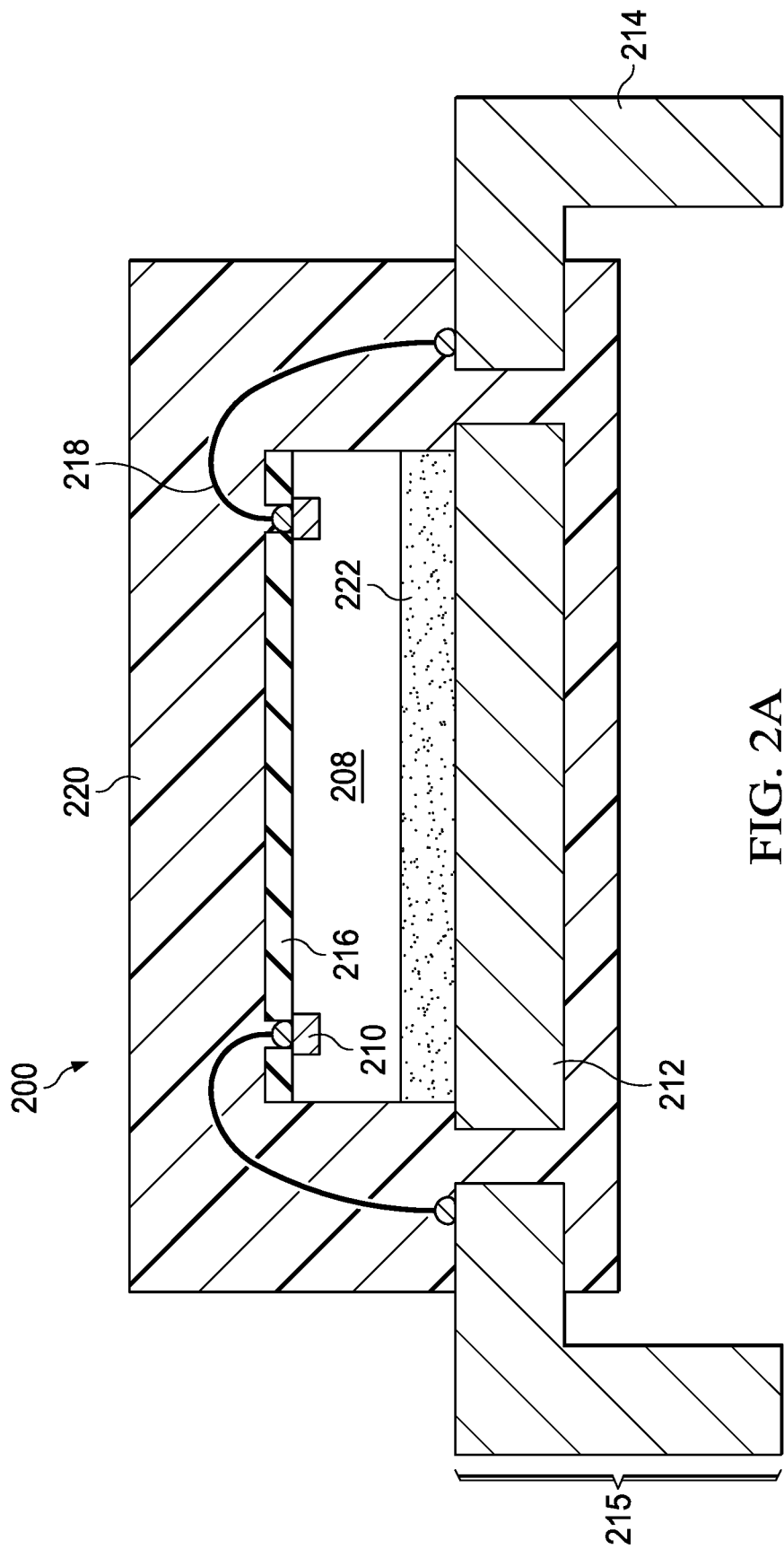
FIG. 2A is a cross section of a dual inline package (DIP) for a packaged semiconductor device and FIG. 2B is a prospective view of a DIP.
Figure 2B:
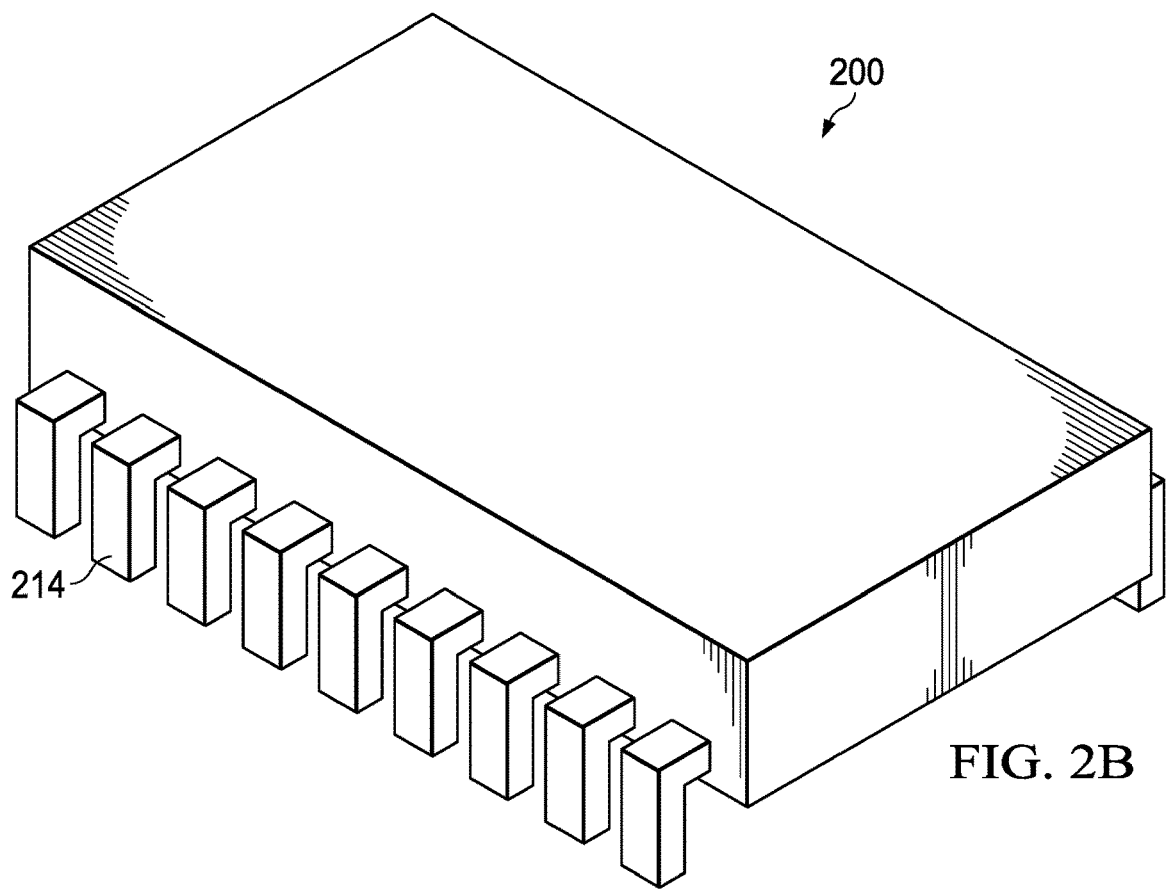

FIG. 2A illustrates in a cross section and FIG. 2B illustrates in a projection view an example dual inline package (DIP). DIP packages have exposed leads on two sides arranged in a line. In FIG. 2A similar reference labels are used for similar elements as are shown in FIG. 1A, for clarity. For example, die 208 in FIG. 2A corresponds to die 108 in FIG. 1A. Die attach layer 222 is an adhesive layer that attaches semiconductor die 208 to a die mount pad 212 of a substrate. In the arrangements, useful substrates can include: lead frames of copper or other conductive metals (such as Alloy 42); molded interconnect substrates ("MIS"); pre-molded lead frames ("PMLFs") with lead frame conductors and mold compound in a preformed structure; tape based and film based substrates carrying conductors; ceramic substrates, laminate substrates with multiple layers of conductors and insulator layers; and printed circuit board ("PCB") substrates of ceramic, fiberglass or resin, or glass reinforced epoxy substrates such as FR4. In this example, the substrate is illustrated using a copper lead frame 215. Passivation layer 216 with openings over the bond pads 210 covers the circuit side surface of the die 208. Substrate leads 214 are connected to bond pads 210 on die 208 by wire bonds 218. In an alternative example, ribbon bonds can be used. The bond pads 210 are in turn coupled to conductors that electrically connect to circuitry in the die 208. Mold compound 220 covers the die 208, the bond wires 218, and portions of the die mount pad 212 and portions of the leads 214. As can be seen in the cross section in FIG. 2A and also in the projection view of the dual in line package (DIP) in FIG. 2B, portions of the leads 214 in the DIP are not covered by mold compound 220. These portions remain uncovered to enable electrical contact between the packaged semiconductor device 200 and traces on a PCB that is not shown, for clarity of illustration. For example, the packaged semiconductor die 200 can be mounted on a PCB by inserting the uncovered portion of leads 214 through holes in traces on a PCB, and then soldering leads 214 to the PCB traces.

Figure 3C:
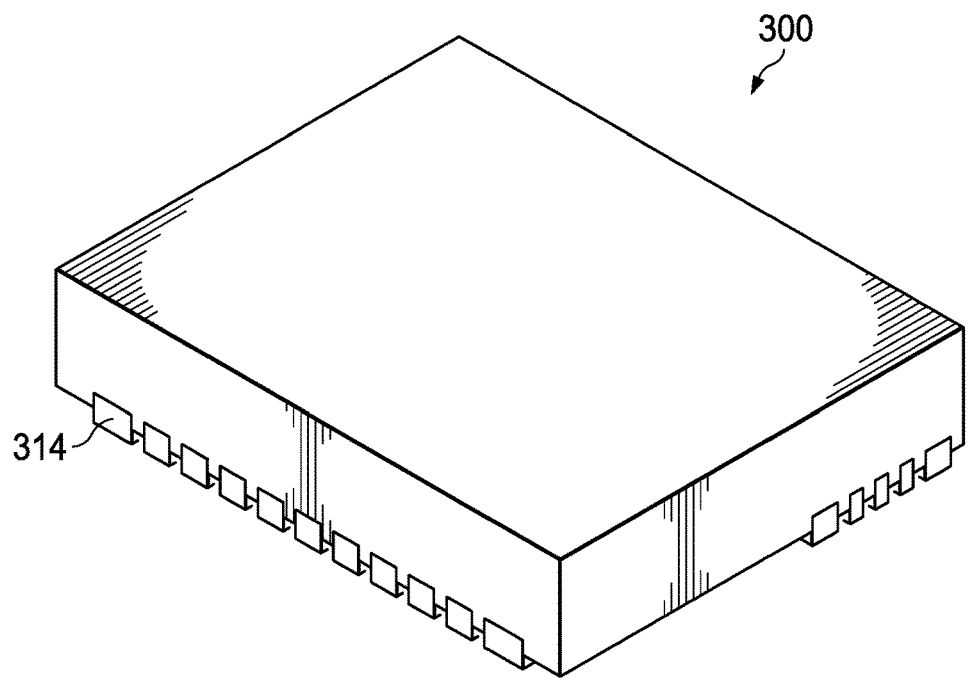

FIGS. 3A-3B illustrate in cross sections, and FIG. 3C illustrates in a projection view, an example no-lead package, such as a quad flat no-lead ("QFN") package. In FIGS. 3A and 3B similar reference labels are used for similar elements as for elements shown in FIG. 2A, for clarity. For example, die 308 in FIGS. 3A and 3B corresponds to die 208 in FIG. 2A. FIG. 3B illustrates a magnified view of a corner portion of die 308. Passivation layer 316 with openings over the bond pads 310 covers a circuit side surface of the die 308. The circuit side surface of the die 308 can be the upper most layer of interconnect, or can be a passivation layer such as silicon dioxide or silicon nitride overlying the upper most layer of interconnect. Die attach layer 322 bonds the non-circuit side of die 308 to the die mount pad 312 of a substrate. In this example the substrate is a copper lead frame 315. In an alternative arrangement, lead frame 315 is a conductive metal or a conductive metal alloy, for example, Alloy 42. Leads 314 are connected to bond pads 310 on die 308 by wire bonds 318. Mold compound 320 covers the die 308, the bond wires 318, and portions of the leads 314.

As can be seen in FIG. 3A and in the projection view of FIG. 3C, portions of the leads 314 in a no-lead package are not covered by mold compound 320 but remain uncovered to enable electrical contact to a PCB (not shown) by soldering the exposed portion of the leads 314 to conductive traces or lands on the PCB. The package mounting process can be described as "surface mounting." FIG. 3C is a projection view of a completed QFN packaged semiconductor device 300.

FIG. 3B is an expanded view of a circuit side corner of the packaged semiconductor device 300. FIG. 3B shows a portion of the semiconductor die 308 with a bond pad 310. A layer of passivation material 316 with an opening over the bond pad 310 covers the surface of the die 308. The passivation layer 316 may be a dielectric material such as silicon dioxide, silicon nitride, silicon oxynitride, or polyimide. A portion of the bond wire 318 connects the bond pad 310 to the lead 314 (shown in FIG. 3A). Mold compound 320 covers the semiconductor die 308, the passivation 316, and bond wire 318, and portions of leads 314, leaving other portions of leads 314 exposed.

The dies 308 are singulated by cutting through the scribe lanes (104 and 106 in FIG. 1A) on the semiconductor wafer 102. The passivation layer 316 on the semiconductor die 308 is cut through forming a sidewall comprised of passivation layer 316 on the scribe lane sidewall 328 of the semiconductor die 308.

A corner 324 between the circuit side surface of the die 308 (upper surface of die 308 as oriented in FIGS. 3A-3B and the scribe lane sidewall of the semiconductor die 308 is formed during singulation. In this arrangement, the upper surface of this corner 324 is covered with passivation layer 316 and the scribe lane sidewall is covered with mold compound 320.

Bond wire 318 can be close to this corner 324 in this packaged semiconductor device 300. In operation or testing, when high voltages (10's or 100's of volts) are applied to the bond wire 318, the thickness 332 of the mold compound can be insufficient to withstand the electric field generated by the high voltage. An electrical short can form between the bond wire 318 and the corner 324 of die 308, causing the packaged semiconductor device 300 to fail.

FIGS. 4A and 4B illustrate in cross sections an arrangement for a packaged semiconductor device for high voltages. In FIGS. 4A and 4B, similar reference labels are used for similar elements shown in FIGS. 3A and 3B, for clarity. For example, die 408 in FIGS. 4A and 4B corresponds to die 308 in FIGS. 3A and 3B. Die attach layer 422 attaches die 408 to a die mount pad 412 of a substrate, in this example the substrate is a lead frame 415. Leads 414 are connected to bond pads 410 on die 408 by wire bonds 418. Mold compound 420 covers the semiconductor die 408, the bond wires 418, and portions of the leads 414 and a portion of the die mount pad 412. The underside (the side opposite to the circuit side of the mounted die 408) of the lead frame 415 is not covered with mold compound to enable electrical connections to be formed to traces on a PCB.

FIG. 4B is an expanded view of a corner of the circuit side of the die 408 for a high voltage semiconductor device package. A first circuit side (upper side as oriented in FIG. 4B) corner 426 of the die 408 is shown with bond pad 410. The first corner 426 between the upper surface (as oriented in FIG. 4B) of the die 408 and a first sidewall 430 of the semiconductor die 408 are covered on both the circuit side surface and the first sidewall 430 with a passivation layer 416. The passivation layer 416 also covers the circuit side (upper side as shown in FIG. 4B) surface of a second corner 424 formed by the circuit side surface of a formed ledge between the non-circuit side end of the first sidewall 430 and the scribe lane sidewall 428. The distance from the second corner 424 to the first corner can be between about 50 μm and 200 μm.

Passivation materials such as oxide, nitride, and polyimide that are used for passivation layer 416 have higher break down voltages than mold compounds 420. The passivation layer 416 covering the first corner 426 increases the voltage that can be applied on the bond wire 418 without causing a short to form between the bond wire 418 and the first corner 426.

The distance 434 between the bond wire 418 and the first corner 426 in FIG. 4B is similar to the distance 332 between the bond wire 318 and the corner 324 in FIG. 3B. The semiconductor device package 400 in FIGS. 4A and 4B can handle a higher voltage than the semiconductor device package 300 in FIGS. 3A and 3B because the first corner 426 in FIG. 4B is completely covered with passivation layer 416, whereas the corner 324 in FIG. 3B is not.

The second corner 424 in FIG. 4B is similar to the corner 324 in FIG. 3B in that the circuit side surface of both corners, 424 and 324, are covered with passivation layers, 416 and 316, and the scribe lane sidewall side on both, 428 and 328, are covered with mold compound, 420 and 320. The distance 432 between the second corner 424 in FIG. 4B and the bond wire 418 is greater than the distance 332 between the corner 324 in FIG. 3B and the bond wire 318. The greater distance 432 between the bond wire 418 and the second corner 424 enables packaged semiconductor device 400 to withstand a higher voltage on bond wire 418 before the mold compound begins breaking down and shorting occurs.

In one arrangement the thickness of the passivation layer 416 on the first sidewall 430 is at least about 10 μm. A preferred distance between the first corner 426 and the second corner 424 is 50 μm or more.

Cross sections in FIGS. 5A-5E illustrate example steps to manufacture the semiconductor device package 400 shown in FIG. 4A. In FIGS. 5A-5E similar reference labels are used for similar elements shown in FIGS. 4A and 4B, for clarity. For example, dies 508 in FIGS. 5A-5E correspond to die 408 in FIGS. 4A and 4B. The flow diagram of FIG. 6 illustrates corresponding method steps.

Figure 5A:
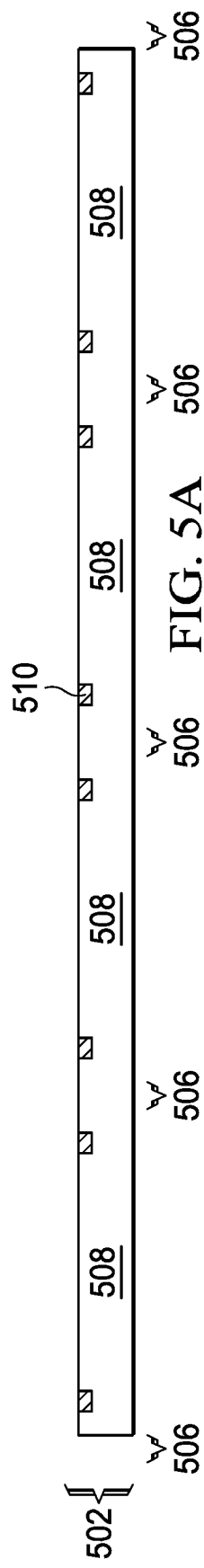
FIGS. 5A-5E are a series of cross sections illustrating example steps in a method for making semiconductor dies with an upper corner covered with passivation.
Figure 6:
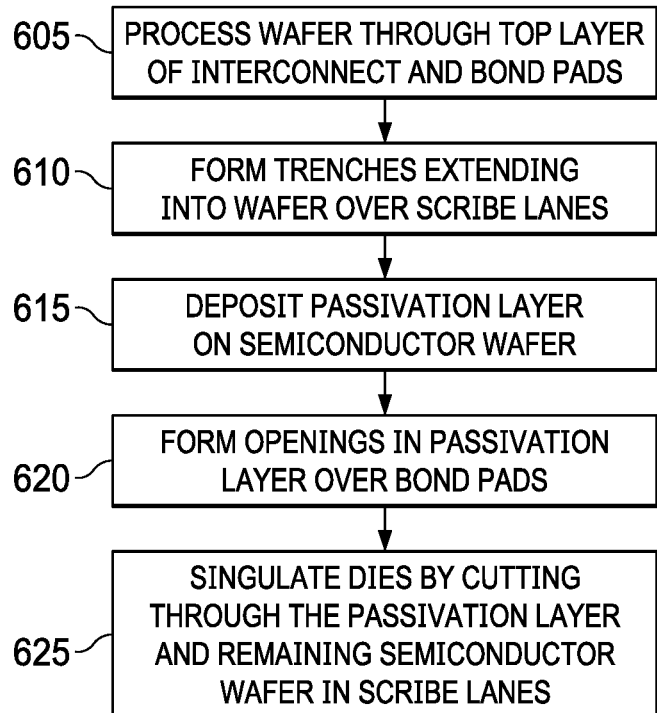
FIG. 6 is a flow diagram of an example method for making a semiconductor die with an upper corner covered with passivation.

In FIG. 6, the method begins at step 605. In step 605 semiconductor wafer processes form semiconductor devices on a substrate or wafer up to the final layer of interconnect and including the bond pads. FIG. 5A shows a cross section of a portion of a semiconductor wafer 502 (see 102 in FIG. 1A) with four dies 508 spaced by scribe lanes 506. The semiconductor dies 508 have bond pads 510 on the circuit side of the semiconductor wafer (the upper surface of 502 as oriented in FIG. 5A).

Figure 5B:
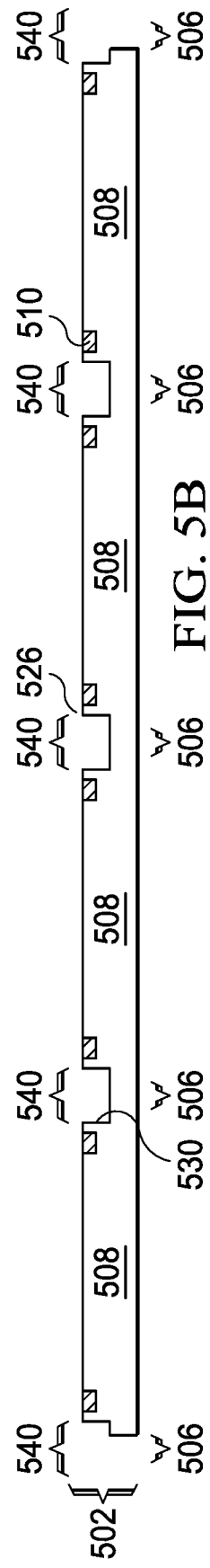

Returning to FIG. 6, at step 610 trenches 540 are cut into the scribe lanes between the semiconductor devices. First die corners 526 are formed at the top of the trench 540 between the surface of the dies and the sidewall 530 of the trench 540. In an example method, mechanical sawing is used to form the trenches. Chemical etching processes, dry etch processes, and laser etching processes can also be used. In FIG. 5B a trench 540 with a width greater than the width of the scribe lane 506 is sawed part way through the wafer 502 (see 104 and 106 in FIG. 1A). In an example application shown in FIG. 5E, the scribe lane 506 is about 40 μm wide and the trench 540 is about 80 μm wide. The trench 540 is centered in the scribe lane 506 with about 20 μm of the trench overhanging the scribe lane 506 on both sides. A first upper corner 526 is formed on the circuit side (upper surface as oriented in FIGS. 5A-5D) of the dies 508 and the sidewall 530 of the trench 540 for each side (four sides, although only two are shown in the cross sections of FIGS. 5A-5D) for each die. The depth of the trench 540 is preferred to be at least 50 μm.

Figure 5C:
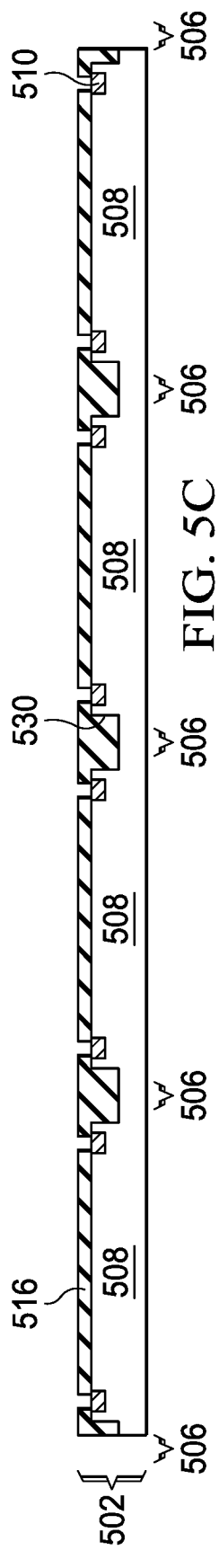

Returning to FIG. 6, at step 615, a passivation layer is formed over the circuit side surface of the semiconductor wafer and filing the trenches 540. At step 620, openings are formed in the passivation layer to expose the bond pads. In FIG. 5C a layer of passivation 516 fills the trenches 540 and covers the circuit side surface of the dies 508 (except for the bond pads 510.) The passivation 516 covers the sidewalls 530 of the trenches 540.

Figure 5D:
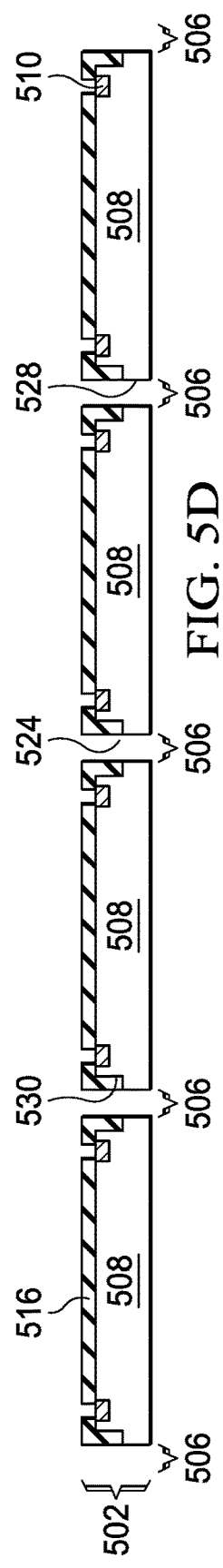
Figure 5E:
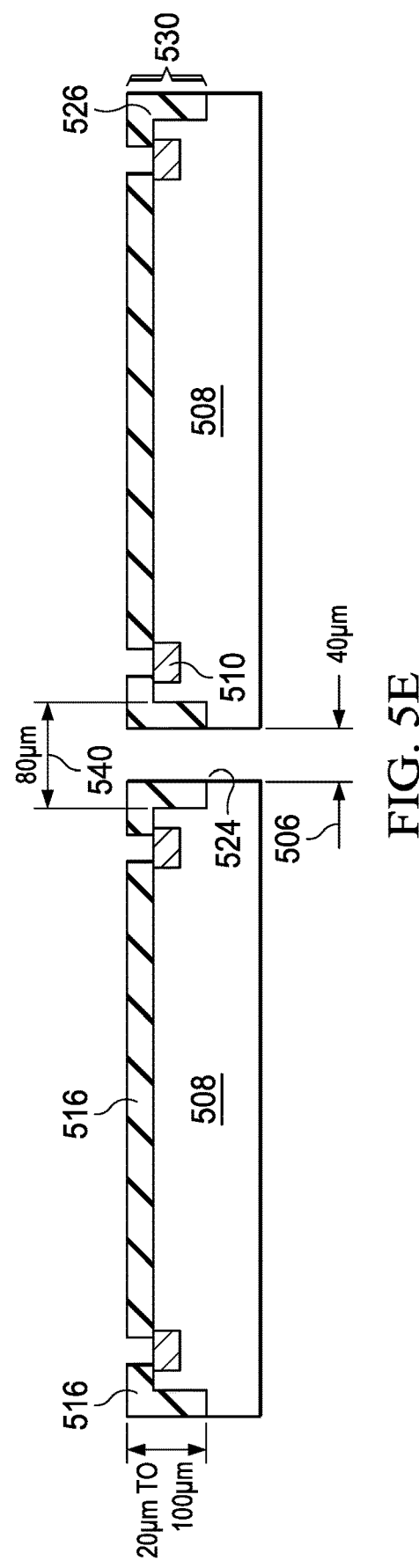

At step 625 in FIG. 6, the dies 508 are singulated from one another by cutting the semiconductor wafer through the scribe lanes and through the passivation layer. FIG. 5D shows dies 508 after the individual dies are singulated by cutting through the scribe lanes 506. The singulation process forms a second corner 524 on the dies 508 below the first corner 526. The second corner 526 is formed between the bottom of the trench 540 and the sidewall 528 of the scribe street 506. Singulation can be performed using lasers, mechanical sawing, or stealth dicing tools to separate the dies and cut through the passivation layer 516 and substrate 502. The singulated dies 508 in FIG. 5D are similar to the die 408 in the packaged semiconductor device 400 in FIG. 4A. Passivation layer 516 covers the surface of the semiconductor dies 508 and covers the sidewall 530 on the first upper corner 526.

The singulation process removes the semiconductor material in scribe lanes 506 by cutting through the passivation layer 516 in the trenches 540, and by cutting through the scribe lanes 506 between the dies 508. About 20 μm of the trench 540 remains on both sides of the cut that singulated the dies 508. The second corner 524 is farther away from the circuit side of the semiconductor dies 508 than the upper first corner 526. The surface of this second corner 524 (bottom of trench 540) is covered with passivation layer 516. The scribe lane sidewall 528 (second sidewall) on the second lower corner 524 524 is exposed, as it was formed by the cutting done in the die singulation process, after passivation layer 516 was completed.

Figure 8:
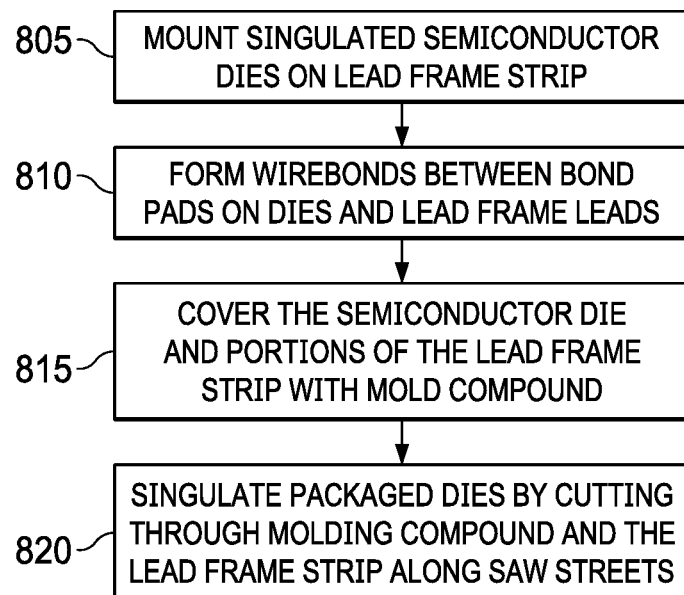
FIG. 8 is a flow diagram of an example method for making a packaged semiconductor device for high voltage.

FIGS. 7A-7E, illustrate in cross sectional views results of manufacturing steps for packaging singulated dies 708. In FIGS. 7A-7E similar reference labels are used for similar elements shown in FIGS. 5A-5D, for clarity. For example, dies 708 in FIGS. 7A-7E correspond to dies 508 in FIGS. 5A-5D. FIG. 8 is a flow diagram illustrating method steps corresponding to the results steps shown in FIGS. 7A-7E.

In FIG. 8, the method begins at step 805, where singulated dies such as 708 in FIG. 7 are mounted on a lead frame strip. In FIG. 7A singulated dies 708 are shown placed with the circuit side "face up" (facing away from the lead frame strip) and are positioned over die mount pads 712 in the lead frame strip 715. FIG. 7A shows a lead frame strip with three lead frames connected together by the lead frame strip 715 in saw streets 706. Lead frame strip 715 can be made of various conductive materials such as copper, brass, and Alloy 42. Pre-molded leadframes (PMLFs) and molded interconnect substrate (MIS) substrates can be used instead of the lead frame strip 715 to form additional arrangements.

In FIG. 7B the singulated dies 708 are bonded to the die mount pads 712 in the lead frame strip 715 using a die attach material 722 such as a conductive adhesive or solder. In an alternative a non-conductive adhesive can be used. When a conductive adhesive is used as 722, the die pads 712 can be used as an electrical connection and may be bonded to a ground trace when the packaged semiconductor device (described further hereinabove) is later mounted on a substrate such as a printed circuit board (PCB) (not shown, for simplicity of illustration). When the die mount pads 712 form a ground terminal of the packaged semiconductor device, this holds the semiconductor substrate of the dies 708 at ground potential. The die mount pads 712 can be used as thermal conductors to remove heat from the die 708 in operation, and can also be used to place the semiconductor material in the dies 708 at potentials other than ground when mounted to a PCB board.

Returning to the flow diagram in FIG. 8, at step 810 wire bonds are formed using bond wires 718 between the bond pads 710 on the dies 708 and the lead frame leads 714 in lead frame strip 715 (see FIG. 7C). While only two bond wires are shown in the cross sections for each die, in a practical application several or even hundreds of bond wires can be used. The lead frame leads 714 are attached to system signal traces when the packaged semiconductor device (described hereinabove) is later mounted on a system board such as a PCB. The signal that is applied to the bond pad 710 on the dies 708 through the lead frame lead 714 and the bond wire 718 can be ground or can be a voltage signal such as a low voltage signal (5 V, 3.3V, 1.8 V or less) or a high voltage signal (10's to 100's or even 1000's of volts).

Returning to FIG. 8, at step 815, the semiconductor dies 708 and a portion of the lead frame strip 715 are covered in mold compound 720. In FIG. 7D the lead frame strip 715 with the singulated dies 708 bonded to the die mounting pads 712 and with the bond wires 718 is encapsulated in or covered with mold compound 720. A bottom side of the lead frame strip 715 (the side opposite to the circuit side of the mounted dies 708) such as the bottom side of leads 714 and the bottom side of die mount pad 712 are not covered with mold compound 720. By leaving these portions of the lead frames uncovered, electrical contact is enabled when the packaged semiconductor devices 700 (see FIG. 7E) are mounted on a system board or substrate.

The dies 708 have a layer of passivation material 716 covered by a layer of mold compound 720 between the first upper corner 726 and the bond wire 718. The layer of passivation 716 over the first upper corners 726 has a high breakdown voltage, and depending upon the thickness of layer 716, can withstand 10's or even 100's of volts without breaking down. The second corners 724 in the dies 708 also have passivation 716 covering the upper surface of a planar ledge that is parallel to the circuit side surface of the semiconductor die. The ledge portion of corners 724 is lower, as oriented in FIG. 6D, than the circuit side surface. The second corners 724 also have mold compound 720 covering the saw street sidewall 728. The thickness (see 432 in FIG. 4) of mold compound 720 between the second corner 724 and the bond wire 718 is greater than the thickness of mold compound 720 (see 434 in FIG. 4) between the first corner 726 and the bond wire 718. This greater distance prevents break down from the bond wire 718 to the second corner 724 when high voltage (30 Volts or more) is applied.

Returning to FIG. 8, the next step in the flow diagram, 820, is to singulate the packaged dies 700 from one another by cutting through the mold compound 720 and the lead frame strip 716 along saw streets 706 between the semiconductor dies. (See FIG. 7E).

The arrangement in FIGS. 7A through 7E is illustrated using an example no lead package such as a QFN, but other package types such as DIPs can also be used. Leaded packages with leads extending away from the package body, and no lead packages such as 600 in FIG. 6E, can also be used.

FIGS. 9A-9I, illustrate, in cross sectional views, results of manufacturing steps for an alternative method of packaging singulated dies 708. In FIGS. 9A-9H similar reference labels are used for similar elements shown in FIGS. 5A-5D, for clarity. For example, dies 908 in FIGS. 9A-9I correspond to dies 508 in FIGS. 5A-5D. FIG. 10 is a flow diagram illustrating method steps corresponding to the results steps shown in FIGS. 9A-9I.

Figure 9A:
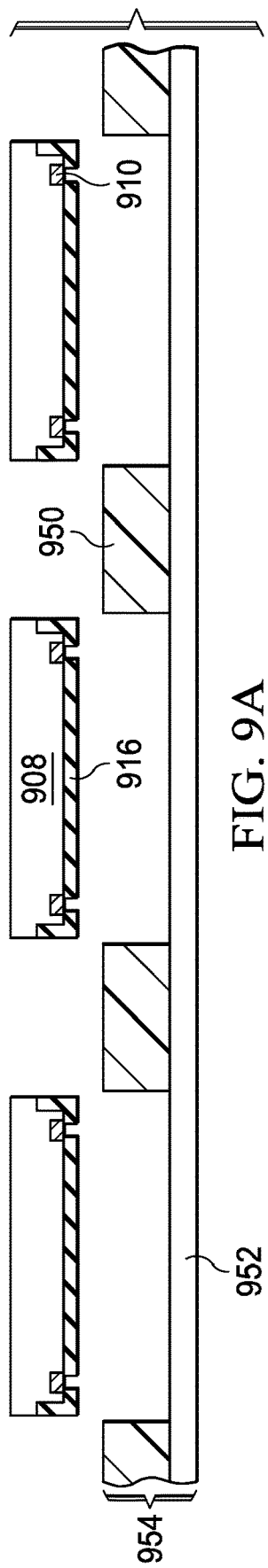
FIGS. 9A-9I are a series of cross sections illustrating steps in a method for making a packaged semiconductor device for high voltage.
Figure 9B:
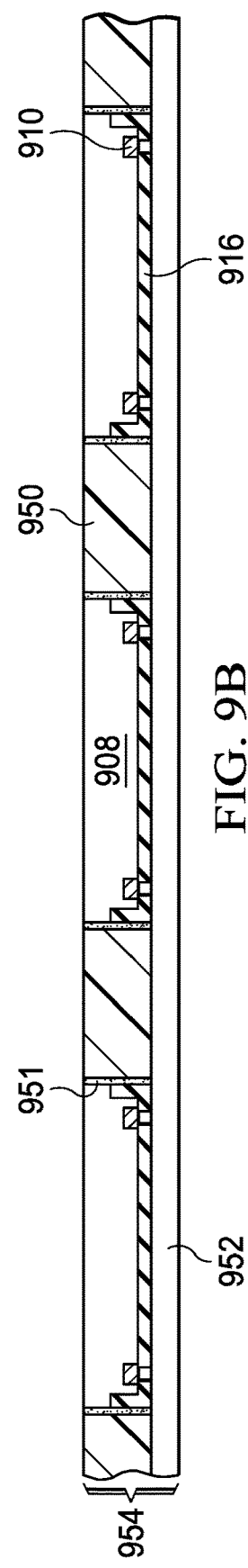
Figure 10:
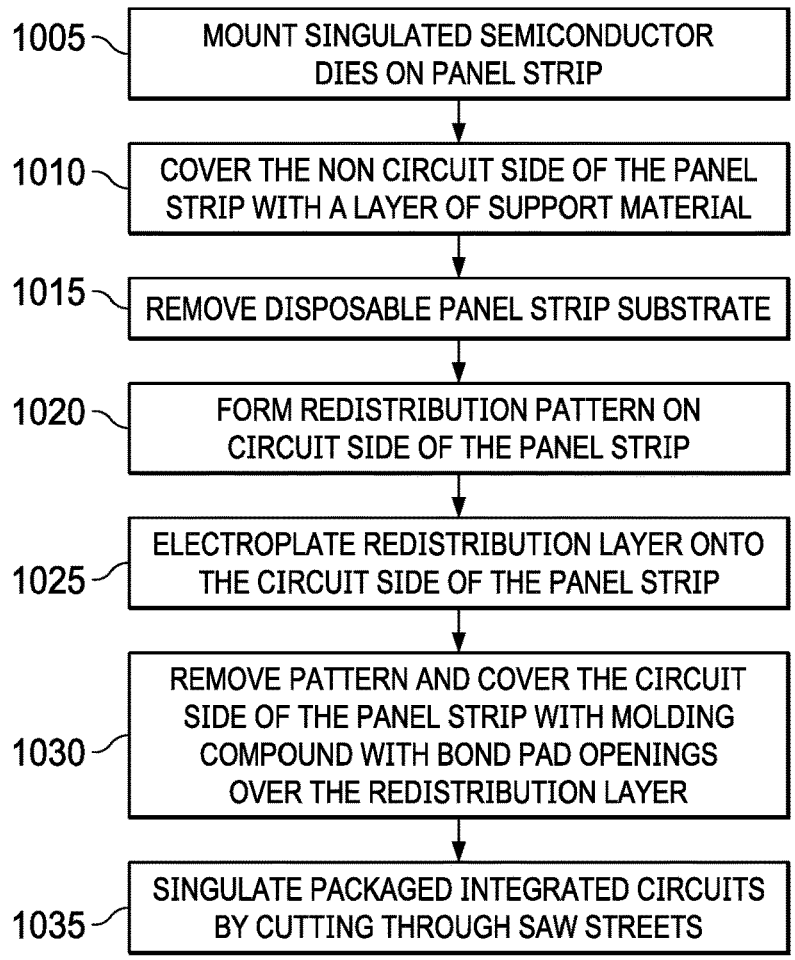
FIG. 10 is a flow diagram of an example method for making a packaged semiconductor device for high voltage.

In FIG. 10, the method begins at step 1005, where singulated dies such as 908 in FIG. 9A are mounted on a panel strip 954. The circuit side of the dies 908 is covered with a passivation layer 916 with openings in the passivation layer exposing bond pads 910. Panel strip 954 is comprised of panels 950, made of a plastic such as a polyimide or polyester, mounted on a disposable substrate 952. Singulated dies 908 with the circuit side facing the disposable substrate 952 are mounted in spaces between panels 950 on the disposable substrate 952. An adhesive 951 can be used to bond the dies 908 to the panels 950. In FIG. 9A singulated dies 908 are shown positioned over the panel strip 954 with the circuit side facing the panel strip 954. FIG. 9B shows the panel strip 950 with three dies 908 mounted on the panel strip 950.

Figure 9C:
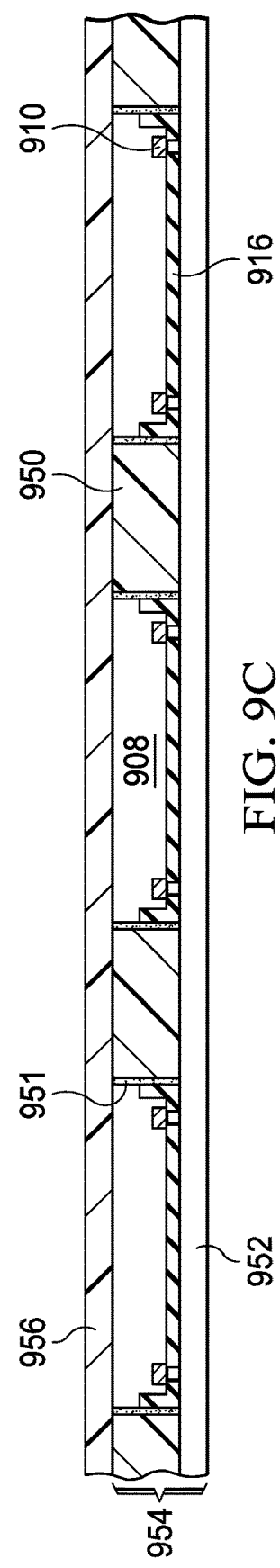

In FIG. 9C, (step 1010, FIG. 10) a first packaging protection layer 956 of a material such as a polyimide or an epoxy resin with silica fillers is formed on the non-circuit side of the dies 908 and on a first side of the panels 950. This first packaging protection layer 956 binds the dies 908 and panels 950 together and provides reinforcement while handling in subsequent processing steps. The first packaging protection layer 956 is at least 30 µm thick. In an example arrangement the first packaging protection layer 956 is 35 µm thick.

Figure 9D:
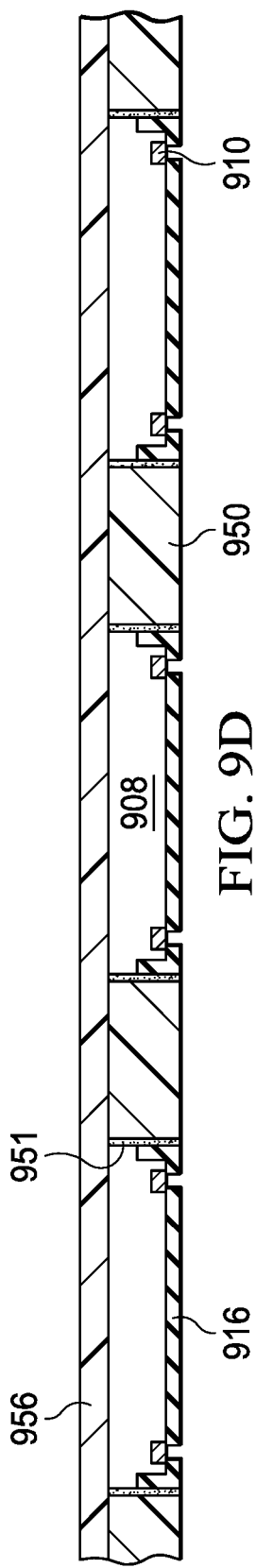
Figure 9E:
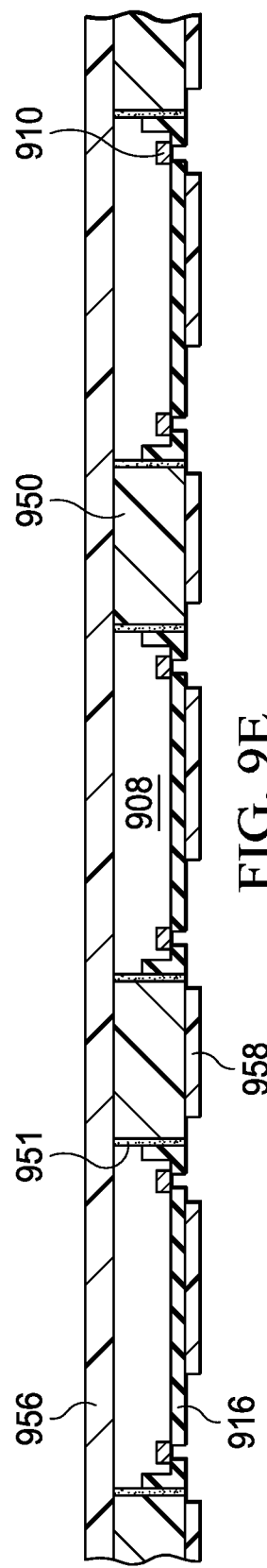

In FIG. 9D, (step 1015, FIG. 10) the disposable substrate 952 is removed from the circuit side of the dies 908 and from the second side of the panels 950.

In FIG. 9 E, (step 1020, FIG. 10) a copper redistribution lead photoresist pattern 958 is applied covering the circuit side of the dies 908 and covering the second side of the panels 950. Openings are formed in the photoresist pattern 958 exposing the bond pads 910.

Figure 9F:
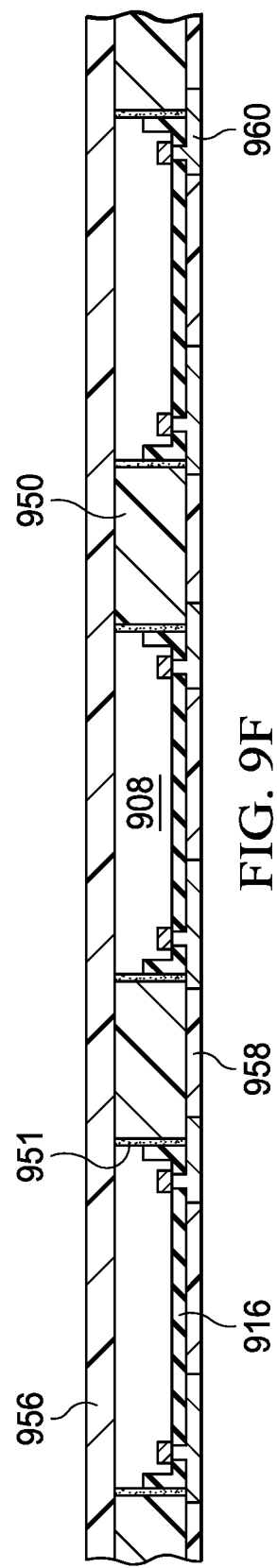

In FIG. 9F, (Step 1025, FIG. 10) copper is electroplated onto the bond pads 910 and filling the openings in the photoresist layer 958 to form copper redistribution leads 960.

Figure 9G:
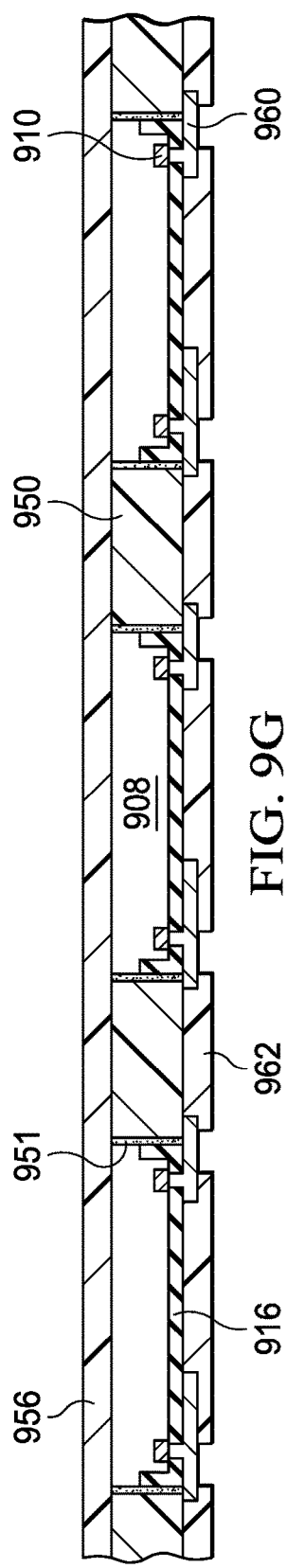

In FIG. 9G, the photoresist pattern 958 is removed and the circuit side of the die 908 and the second side of the panels between each of the dies 908 are covered with a second packaging protection layer 962. The second packaging protection layer 962 is a dielectric material such as a polyimide or build up material. The second packaging protection layer 962 is at least 30 µm thick. In an arrangement the second packaging protection layer 962 is 40 µm thick.

Bond pad openings are formed in the second packaging protection layer 962 exposing the surface copper redistribution leads 960. The bond pad openings can be formed by exposure and develop if the packaging protection layer 962 material is photo sensitive or by patterning and etching if it is not a photosensitive material. Alternatively, the packaging protection layer 962 can be deposited using ink-jet printing, screen printing, or slit printing.

Figure 9H:
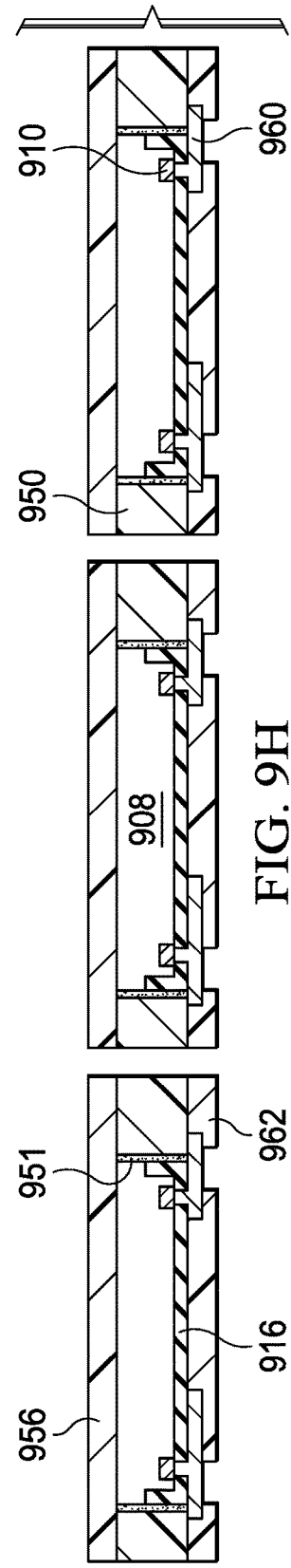

In FIG. 9H, individual dies 908 are singulated by cutting through the packaging protection layers, 956 and 962, and the panels 950 approximately midway between the dies 908.

Figure 9I:
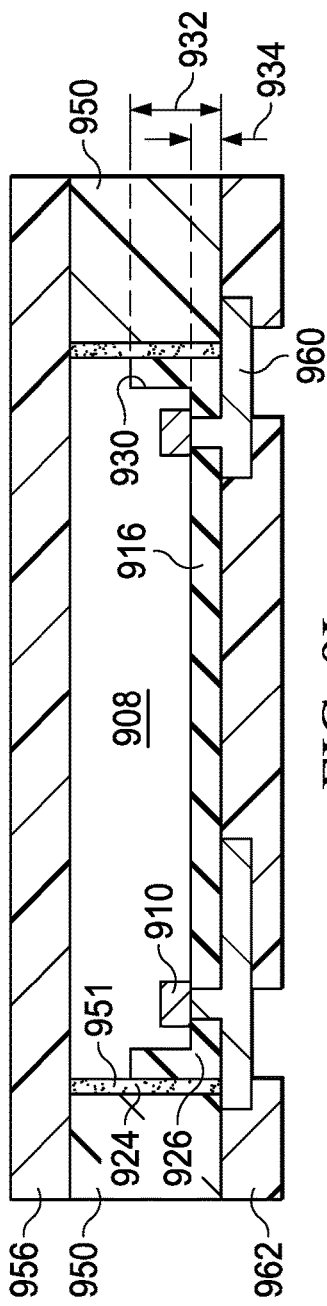

FIG. 9I shows an expanded view of one of the singulated dies 908. Both sides of the first corner 926 on the die 908 are covered with passivation material 916 that has a high breakdown voltage. Second corner 924 is covered on the side facing the copper redistribution lead 960 with passivation material 916 and on the sidewall with the adhesive layer 951. The adhesive layer 951 can have a lower breakdown voltage lower than the passivation material 916. The greater distance 932 of the second corner 924 than the distance 934 of the first corner 926 from the copper redistribution lead 960 enables a higher voltage to be applied to the copper redistribution lead 960 without causing breakdown and shorting.

Figure 12:
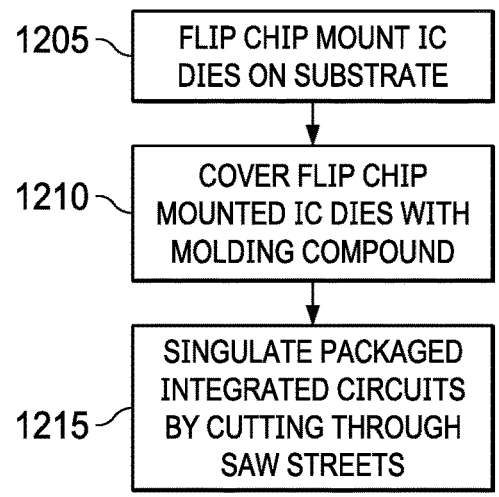
FIG. 12 is a flow diagram of an example method for making a packaged semiconductor device for high voltage.

FIGS. 11A-11E, illustrate in cross sectional views results of manufacturing steps for an alternative method of packaging singulated dies 1108. In FIGS. 11A-11E similar reference labels are used for similar elements shown in FIGS. 5A-5D, for clarity. For example, dies 1108 in FIGS. 11A-11E correspond to dies 508 in FIGS. 5A-5D. FIG. 12 is a flow diagram illustrating method steps corresponding to the results steps shown in FIGS. 11A-11E.

In FIGS. 11A and 11B (Step 1205, FIG. 12) semiconductor dies 1108 are flip chip mounted on substrate strip 1154. Substrate strip 1154 consists of a substrate 1166 with conductive leads 1168 on the surface. Substrate 1166 can be a circuit board such as fiberglass with conductive leads 1168 on the surface. The substrate can also be molded interconnect substrates; pre-molded lead frames with lead frame conductors and mold compound in a preformed structure; tape based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4.

The semiconductor dies 1108 have conductive posts 1162 capped with a solder ball 1164 on each bond pad 1110. The surface of the die 1108 surrounding the conductive posts 1162 is covered with passivation layer 1116.

In FIG. 11A the dies 1108 are inverted over the substrate strip 1154 with the solder balls 1164 aligned to conductive leads 1168 on the substrate strip 1154. In FIG. 11B the solder balls are melted forming solder bonds between the conductive posts 1162 and the leads 1168.

In FIG. 11C. (step 1210, FIG. 12) the surface of the substrate strip 1154 and the semiconductor die 1108 are covered with a molding compound 1120 such as a filled epoxy compound.

Figure 11D:
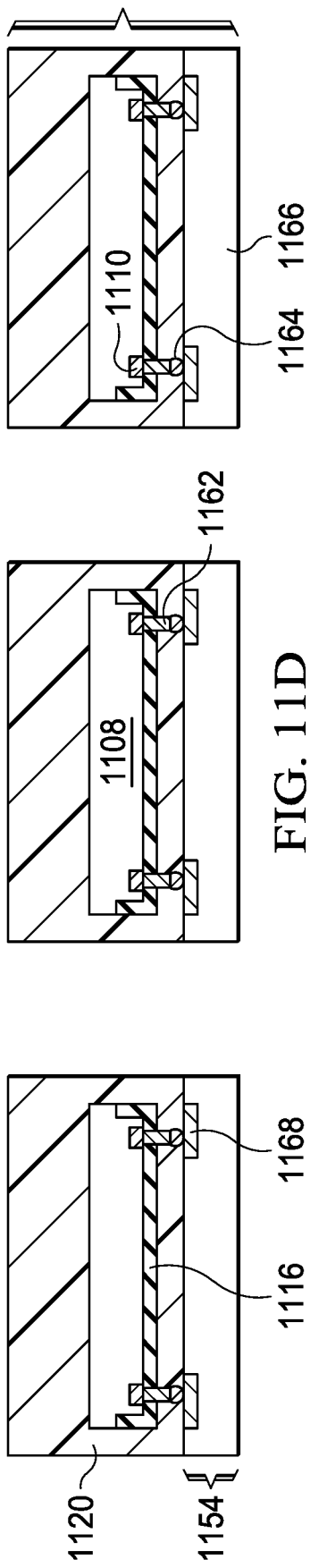

In FIG. 11D (step 1215, FIG. 12) individual semiconductor device packages are formed by cutting through the molding compound 1120 and the substrate 1166 approximately midway between the dies 1108.

Figure 11E:
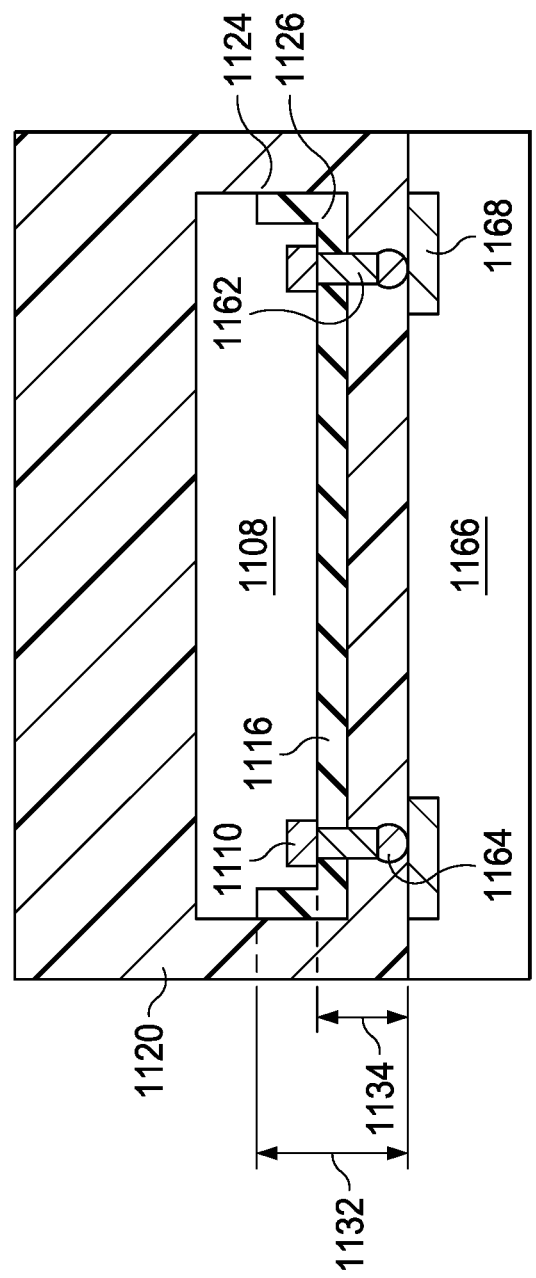

FIG. 11E shows an expanded view of one of the packaged semiconductor dies 1108. The first corner 1126 of the die 1108 facing the substrate 1166 is covered on both the side facing the substrate 1166 and the sidewall with passivation layer 1116. The second corner 1124 is covered on the side facing the substrate 1166 with the passivation layer 1116 and on the sidewall with molding compound 1120. The passivation layer 1116 has a higher breakdown voltage than the molding compound 1120. The greater distance 1132 of the second corner 1124 than the distance 1134 of the first corner 1126 to the substrate lead 1168 enables a higher voltage to be applied to the substrate lead 1168 without break down of the mold compound and without causing shorting to the die 1108.

Modifications are possible in the described arrangements, and other alternative arrangements are possible within the scope of the claims.

What is claimed is:

1. A device, comprising:
a first corner formed between a circuit side surface of a semiconductor die and a first sidewall formed with a first depth extending along a side of the semiconductor die from the circuit side surface;
a ledge having a planar surface formed parallel to the circuit side surface of the semiconductor die formed at the first depth from the circuit side surface at the first corner, and being perpendicular to the first sidewall;
a second corner formed by an intersection of the planar surface of the ledge and a scribe lane sidewall of the semiconductor die, forming a second sidewall perpendicular to the circuit side surface; and
portions of the circuit side surface of the semiconductor die, the first corner, the first sidewall, and the planar surface of the ledge covered by a passivation layer, the passivation layer including a surface substantially coplanar with the second sidewall.

2. The device of claim 1, wherein a thickness of the passivation layer is at least 10 µm.

3. The device of claim 1, wherein the passivation layer is a material that is one selected from a group consisting essentially of: silicon dioxide, silicon nitride, silicon oxynitride, polyimide, and combinations thereof.

4. The device of claim 1, wherein the first depth is between about 20 µm and 100 µm.

5. The device of claim 1, wherein a width of the ledge extending from the first sidewall to the scribe lane sidewall is at least about 20 µm.

6. The device of claim 1, wherein the second sidewall is exposed from the passivation layer.

7. A packaged semiconductor device, comprising:
a semiconductor die bonded to a conductive substrate, the semiconductor die having bond pads formed on a circuit side surface of the semiconductor die;
a first corner formed between the circuit side surface of the semiconductor die and a first sidewall formed with a first depth extending into the semiconductor die from the circuit side surface;
a ledge having a planar surface formed parallel to the circuit side surface of the semiconductor die at the first depth from the circuit side surface at the first corner, and being perpendicular to the first sidewall;
a second corner formed by an intersection of the planar surface of the ledge and a scribe lane sidewall of the semiconductor die, the scribe lane sidewall perpendicular to the circuit side surface; and
portions of the circuit side surface of the semiconductor die, the first corner, the first sidewall, and the planar surface of the ledge covered by a passivation layer;
openings in the passivation layer exposing the bond pads of the semiconductor die;
a conductor coupling a bond pad of the semiconductor die to a lead on the conductive substrate;
a gap between the passivation layer and the conductor; and
mold compound covering the passivation layer, covering the scribe lane sidewall, covering the conductor, filling the gap, covering the semiconductor die and covering a portion of the conductive substrate.

8. The packaged semiconductor device of claim 7, wherein the conductor is a bond wire.

9. The packaged semiconductor device of claim 7, further comprising
a copper redistribution lead over the passivation layer, the copper redistribution lead contacting the bond pad,
a packaging protection layer covering the copper redistribution lead; and
an opening in the packaging protection layer exposing a surface of the copper redistribution lead.

10. The packaged semiconductor device of claim 7, wherein the conductor is a metal post with a first end of the metal post connected to the bond pad, and a second end of the metal post connected to the bond pad.

11. The packaged semiconductor device of claim 7, wherein a thickness of the passivation layer is at least 10 µm.

12. The packaged semiconductor device of claim 7, wherein the passivation layer is one selected from a group consisting essentially of: silicon dioxide, silicon nitride, silicon oxynitride, and polyimide.

13. The packaged semiconductor device of claim 7, further comprising:
the scribe lane sidewall covered with and in contact with mold compound.

14. The packaged semiconductor device of claim 13, wherein a distance between the second corner and the first corner is between about 20 µm and 100 µm.

15. The packaged semiconductor device of claim 13, wherein a width of the ledge from the first sidewall to the scribe lane sidewall is at least 20 µm.

* * * * *